(12) United States Patent
Sato et al.

(10) Patent No.: US 8,283,700 B2
(45) Date of Patent: Oct. 9, 2012

(54) FIELD EFFECT TRANSISTOR AND MANUFACTURING METHOD THEREOF

(75) Inventors: Yoshihiro Sato, Kanagawa (JP); Takehiko Nomura, Kanagawa (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 13/072,798

(22) Filed: Mar. 28, 2011

(65) Prior Publication Data

US 2011/0254055 A1   Oct. 20, 2011

(30) Foreign Application Priority Data

Mar. 29, 2010   (JP) ................................. 2010-074627

(51) Int. Cl.
*H01L 29/66* (2006.01)

(52) U.S. Cl. .................. 257/192; 257/194; 257/E21.403

(58) Field of Classification Search .................. 257/194, 257/E29.246, E21.403, 192, 213, 615; 438/142, 438/270, 259

See application file for complete search history.

(56) References Cited

U.S. PATENT DOCUMENTS

2009/0250767 A1 * 10/2009 Nomura et al. ............... 257/392

FOREIGN PATENT DOCUMENTS

| JP | 2000-252458 | | 9/2000 |
|---|---|---|---|
| JP | 2009-059816 | * | 3/2009 |

* cited by examiner

*Primary Examiner* — A. Sefer
*Assistant Examiner* — Nikolay Yushin
(74) *Attorney, Agent, or Firm* — Jianq Chyun IP Office

(57) ABSTRACT

A field effect transistor includes a channel layer of group-III nitride-based compound semiconductor; an interface layer formed on the channel layer and of $Al_X In_Y Ga_{1-X-Y}N$, where $0 \leq X \leq 1$, $0 \leq Y \leq 1$, and $X+Y \leq 1$, which is different from material of the channel layer, an electron supplying layer of group-III nitride-based compound semiconductor formed on the interface layer, the electron supplying layer having a recess that reaches the interface layer; a source electrode and a drain electrode formed on the electron supplying layer on respective sides of the recess; an insulating film formed on an inner surface of the recess; and a gate electrode formed on the insulating film.

9 Claims, 10 Drawing Sheets

FIELD EFFECT TRANSISTOR AND MANUFACTURING METHOD THEREOF

BACKGROUND

1. Technical Field

The present invention relates to a transistor of group-III nitride-based compound semiconductor used as a power electronic device or a high-frequency amplifying device, and a method of manufacturing the transistor.

2. Related Art

A wide bandgap semiconductor can be exemplified by group-III nitride-based compound semiconductor, and has high breakdown voltage, high electron mobility, and high thermal conductivity. Therefore, such a wide bandgap semiconductor is extremely useful as a material in semiconductor devices used in ways that involve high power, high frequency, or high temperature environments. For example, a field effect transistor (FET) having an AlGaN/GaN heterojunction structure is polarized due to the Piezo effect, causing a 2-dimensional electron gas (2DEG) to be formed at the interface. The 2DEG has high electron mobility and high carrier density, and therefore this type of FET can be expected for use as a power switching device with low ON-resistance and high-speed switching characteristics.

Furthermore, it is desirable that the switching element have a fail safe for preventing current from flowing when there is a problem. In other words, the switching element is required to perform a normally-off operation. A metal insulator semiconductor FET (MISFET) is known as a device having such a characteristic.

FIG. 12 shows an example of a conventional FET using GaN. A FET 900 shown in FIG. 12 includes a buffer layer 12 and an underlayer 13 of undoped AlGaN on a substrate 11 of, for example, sapphire. In the FET 900, an electron supplying layer 14 of n-type AlGaN and an electron transit layer 15 of n-type GaN are sequentially grown on the underlayer 13. A gate electrode 17 is formed above the electron transit layer 15, with an insulating film 16 interposed therebetween. The insulating film 16 is formed of a first insulating film 16a of AlN and a second insulating film 16b of $SiO_2$ sequentially on the electron transit layer 15. A source electrode 18 and a drain electrode 19 are formed on the first insulating film 16a.

In the FET 900, a leak current can be suppressed due to the second insulating film 16b, as described in Patent Document 1.

Patent Document 1: Japanese Patent Application Laid-open No. 2000-252458

However, the FET 900 described in Patent Document 1 has the following problem. Since the source electrode 18 and the drain electrode 19 are formed on the first insulating film 16a of AlN, the FET 900 has high contact resistance and high ON-resistance. Furthermore, it is necessary to lower the impurity concentration of the electron transit layer 15 in order to achieve a normally-off operation. When the impurity concentration of the electron transit layer 15 is lowered, however, the carrier mobility decreases.

The present invention has been achieved in view of the above aspects, and it is an object of the present invention to provide a normally-off FET that has high mobility and low ON-resistance.

SUMMARY

According to a first aspect of the present invention, there is provided a field effect transistor including a channel layer of group-III nitride-based compound semiconductor, an interface layer formed on the channel layer and of $Al_XIn_YGa_{1-X-Y}N$, where $0 \leq X \leq 1$, $0 \leq Y \leq 1$, and $X+Y \leq 1$, which is different from material of the channel layer, an electron supplying layer of group-III nitride-based compound semiconductor formed on the interface layer, the electron supplying layer having a recess that reaches the interface layer, a source electrode and a drain electrode formed on the electron supplying layer on respective sides of the recess, an insulating film formed on an inner surface of the recess; and a gate electrode formed on the insulating film.

According to a second aspect of the present invention, there is provided a field effect transistor including a channel layer of group-III nitride-based compound semiconductor, an interface layer formed on a first portion of the channel layer and made of $Al_XIn_YGa_{1-X-Y}N$, where $0 \leq X \leq 1$, $0 \leq Y \leq 1$, and $X+Y \leq 1$, which is different from material of the channel layer, an electron supplying layer of group-III nitride-based compound semiconductor formed on second portions of the channel layer on both sides of the interface layer, a source electrode and a drain electrode formed on the electron supplying layer, an insulating film formed on the interface layer; and a gate electrode formed on the insulating film.

According to a third aspect of the present invention, there is provided a method of manufacturing a field effect transistor. The method includes forming a channel layer and an interface layer of group-III nitride-based compound semiconductor on a substrate in a row, forming an electron supplying layer of group-III nitride-based compound semiconductor on the interface layer, forming a recess that reaches the interface layer in a portion of the electron supplying layer, forming a source electrode and a drain electrode on the electron supplying layer on respective sides of the recess, forming an insulating film on an inner surface of the recess; and forming a gate electrode on the insulating film.

According to a fourth aspect of the present invention, there is provided a method of manufacturing a field effect transistor. The method includes forming a channel layer and an interface layer of group-III nitride-based compound semiconductor on a substrate in a row, removing a portion of the interface layer to expose the channel layer, forming an electron supplying layer of the group-III nitride-based compound semiconductor on both sides of the interface layer on the portion of the channel layer from which the interface layer is removed, forming a source electrode and a drain electrode on the electron supplying layer, forming an insulating film on the interface layer; and forming a gate electrode on the insulating film.

The present invention can prevent dispersion caused by roughness and interface levels between an insulating layer and a channel layer by using an interface layer formed therebetween, and can therefore improve the carrier mobility in the channel layer. The present invention generates 2DEG via the Piezo effect in a portion of the channel layer other than a gate portion where the gate electrode is formed by providing an electron supplying layer on a portion of the interface layer other than the gate section, thus realizing high mobility. Since a source electrode and a drain electrode are formed on the electron supplying layer, the present invention has low contact resistance and low ON-resistance.

The summary clause does not necessarily describe all necessary features of the embodiments of the present invention. The present invention may also be a sub-combination of the features described above.

DESCRIPTION OF EXEMPLARY EMBODIMENTS

Exemplary embodiments of the present invention will be described in detail below with reference to accompanying drawings. However, the embodiments should not be construed to limit the invention. All the combinations of the features described in the embodiments are not necessarily essential to means provided by aspects of the invention.

Figure 1:
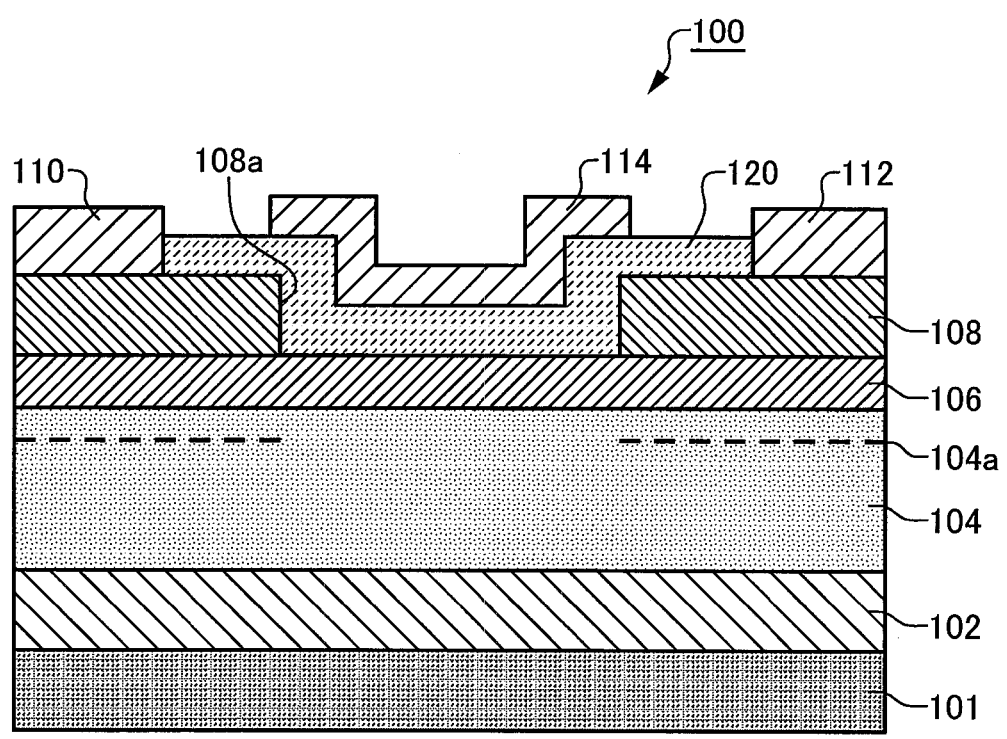
FIG. 1 is a schematic cross-sectional view of a FET according to a first embodiment of the present invention.

FIG. 1 is a schematic cross-sectional view of a FET 100 according to a first embodiment of the present invention. As shown in FIG. 1, the FET 100 includes a buffer layer 102 on a substrate 101, and a channel layer 104, an interface layer 106, and an electron supplying layer 108 of group-III nitride-based compound semiconductor, in the stated order. The group-III nitride-based compound semiconductor forming the channel layer 104, the interface layer 106, and the electron supplying layer 108 can be expressed as $Al_X In_Y Ga_{1-X-Y} N$, where $0 \leq X \leq 1$, $0 \leq Y \leq 1$, and $X+Y \leq 1$. The interface layer 106 may be formed of a different material than the channel layer 104. The electron supplying layer 108 may be formed of a different material than the channel layer 104 and the interface layer 106. The electron supplying layer 108 may be formed of a material with larger bandgap energy than the material used to form the channel layer 104. As a result, a 2DEG region 104a may be generated near the interface of the channel layer 104 on the electron supplying layer 108 side, in the region where the electron supplying layer 108 is formed above the channel layer 104. The interface layer 106 may be formed of a material with larger bandgap energy than the material used to form the electron supplying layer 108. The composition of each layer may be set such that bandgap energy of each layer sequentially increases in order of the channel layer 104, the electron supplying layer 108, and the interface layer 106. In other words, there may be a large bandgap energy difference between the channel layer 104 and the interface layer 106 generating 2DEG on the channel layer 104 side due to the Piezo effect, and therefore electrons flow to the region where the 2DEG is generated.

The FET 100 includes a source electrode 110 and a drain electrode 112 formed on the electron supplying layer 108 at a distance from each other. The FET 100 may include a recess 108a between the source electrode 110 and the drain electrode 112 that penetrates through the electron supplying layer 108 to reach the interface layer 106. An insulating film 120 may be formed on the inner surface of the recess 108a. A gate electrode 114 may be formed above the recess 108a, with the insulating film 120 interposed therebetween. The electron supplying layer 108 may include a hole through which the recess 108a passes. The portion of the interface layer 106 corresponding to the recess 108a may be thinner than other portions thereof.

The channel layer 104 is made of undoped GaN or p-type GaN, which has an acceptor concentration no less than $1 \times 10^{15}$ cm$^{-3}$ and no larger than $5 \times 10^{17}$ cm$^{-3}$, for example.

If the FET 100 is normally-off, the gate electrode 114 may be formed above the channel layer 104 with the insulating film 120 interposed therebetween. The insulating film 120 of the FET 100 may be formed of $SiO_2$ or SiN. If an insulating film of $SiO_2$ or SiN is formed directly on the channel layer 104, the carrier mobility of the channel layer 104 decreases. This is believed to be because, when the non-crystalline insulating film is formed on the crystalline semiconductor layer, the electrons serving as carriers are dispersed by a plurality of energy levels formed at the interface and the roughness of the interface of the semiconductor layer.

The FET 100 includes, on the channel layer 104 of group-III nitride-based compound semiconductor, the interface layer 106 of group-III nitride-based compound semiconductor and having larger bandgap energy than the channel layer 104. Therefore, the crystal periodicity of the channel layer 104 and the interface layer 106 is maintained. As a result, the channel layer 104 has high carrier mobility.

The interface layer 106 may have a thickness that does not cause a 2DEG region 104a to be formed on the channel layer 104 due to the heterojunction with the channel layer 104. The thickness of the interface layer 106 is preferably no less than 0.05 nm and no larger than 3.0 nm. If the thickness of the interface layer 106 is less than 0.05 nm, the effect of suppressing carrier dispersion cannot be achieved. If the thickness of the interface layer 106 is larger than 3.0 nm, a 2DEG is generated by the heterojunction with the channel layer 104, which prevents the gate electrode 114 from achieving sufficient depletion, so that the FET 100 is normally-on. The portion of the interface layer 106 in the recess 108a where the electron supplying layer 108 is removed may have a thickness no less than 0.05 nm and no larger than 3.0 nm, and the other portion of the interface layer 106 may have a thickness larger than 3.0 nm. As a result, a 2DEG region 104a may be prevented from being formed on the portion of the channel layer 104 below the recess 108a where the electron supplying layer 108 is removed.

The FET 100 includes the electron supplying layer 108 of group-III nitride-based compound semiconductor on at least a portion of the interface layer 106. Accordingly, in the region where the electron supplying layer 108 is formed, the 2DEG region 104a is formed on the channel layer 104 side of the interface between the interface layer 106 and the channel layer 104. The 2DEG region 104a has high electron density and high mobility. As a result, the FET 100 has low ON-resistance and favorable switching characteristics.

The electron supplying layer 108 is exemplified by AlInGaN and may be formed of a material, e.g. $Al_X Ga_{1-X} N$ ($0 < X \leq 1$), with larger bandgap energy than the material, e.g. GaN, used to form the channel layer 104.

The electron supplying layer 108 is preferably doped with n-type impurities. As a result, the electron supplying layer 108 has lower contact resistance with respect to the source electrode 110 and the drain electrode 112. The method for doping the impurities in the electron supplying layer 108 can be any known method such as ion implantation or doping by introducing a raw material gas containing desired impurities during growth of the electron supplying layer 108.

A layer of group-III nitride-based compound semiconductor with high impurity concentration may be formed between the electron supplying layer 108 and the source electrode 110 and the drain electrode 112. In this way, the first embodiment can provide a FET including a channel layer with high carrier mobility and favorable ON characteristics.

The following describes a method of manufacturing the FET 100 shown in FIG. 1, with reference to FIGS. 2 to 5. Components in FIGS. 2 to 5 having the same reference numerals as components in FIG. 1 may adopt the same function and configuration.

Figure 2:
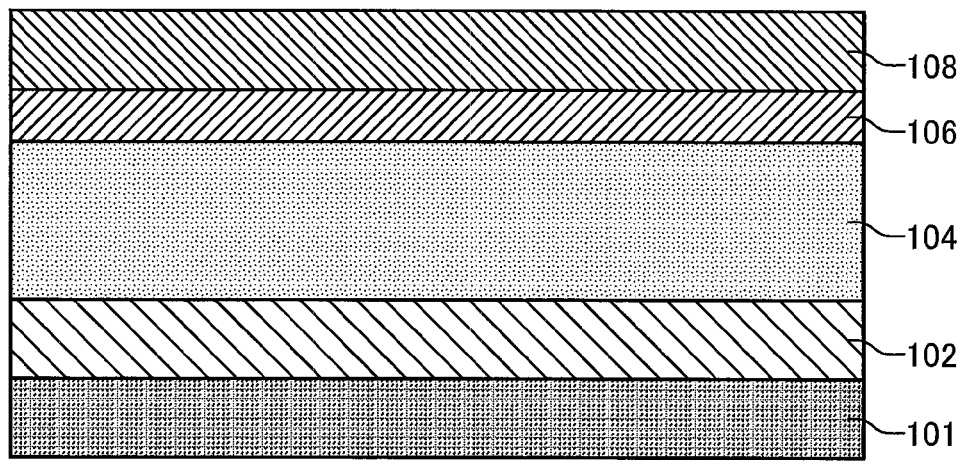
FIG. 2 is a schematic cross-sectional view showing a step of forming a buffer layer, a channel layer, an interface layer, and an electron supplying layer of the FET shown in FIG. 1.

First, the buffer layer 102 may be formed on the substrate 101 of silicon having the (111) plane as a surface for forming the semiconductor layers. The buffer layer 102 may be formed of a plurality of layers including AlGaN/GaN. The channel layer 104 may be formed on the buffer layer 102. The channel layer 104 may be formed of undoped GaN. The interface layer 106 may be formed on the channel layer 104. The interface layer 106 may be formed of AlN. The electron supplying layer 108 may be formed on the interface layer 106. The electron supplying layer 108 may be formed of AlGaN. The buffer layer 102, the channel layer 104, the interface layer 106, and the electron supplying layer 108 may be formed using, as the raw material gas, two or more of trimethyl gallium (TMGa), trimethyl aluminum (TMAl), and ammonia ($NH_3$) (FIG. 2).

The interface layer 106 is preferably grown immediately after the channel layer 104 in the same apparatus, so that the channel layer 104 and the interface layer 106 can be grown with the same crystal state, i.e. epitaxially grown. As a result, the interface level density between the channel layer 104 and the interface layer 106 is decreased, and the carrier mobility of the channel layer 104 is improved.

The buffer layer 102 may be made of a material having a function to lessen lattice mismatch between the substrate 101 and the channel layer 104, and is not limited to the structure described above. For example, the buffer layer 102 may be formed of a plurality of layers of AlN/GaN. The thickness of each layer and the total number of layers may be set as needed to decrease the threading dislocation density, for example.

If the substrate 101 is made using a material with small lattice mismatch with respect to the channel layer 104 or using a material with the same lattice constant as the channel layer 104, the buffer layer 102 may be omitted and the channel layer 104 may be formed directly on the substrate 101.

Figure 3:
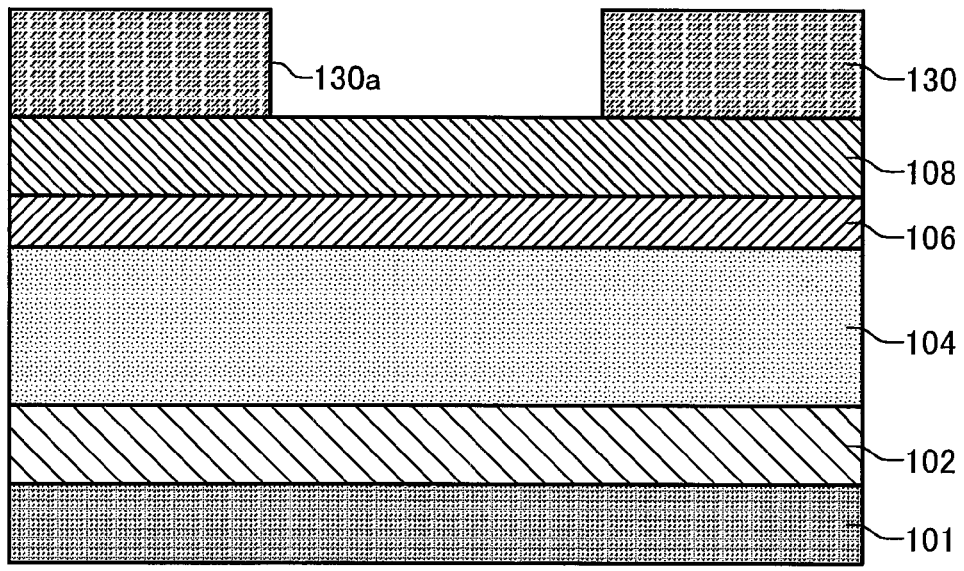
FIG. 3 is a schematic cross-sectional view showing a step of forming a mask for manufacturing the FET shown in FIG. 1.

Next, a $SiO_2$ layer is formed over the entire surface of the electron supplying layer 108, and photolithography is used to form a mask 130 having an opening 130a at a gate section (FIG. 3).

Figure 4:
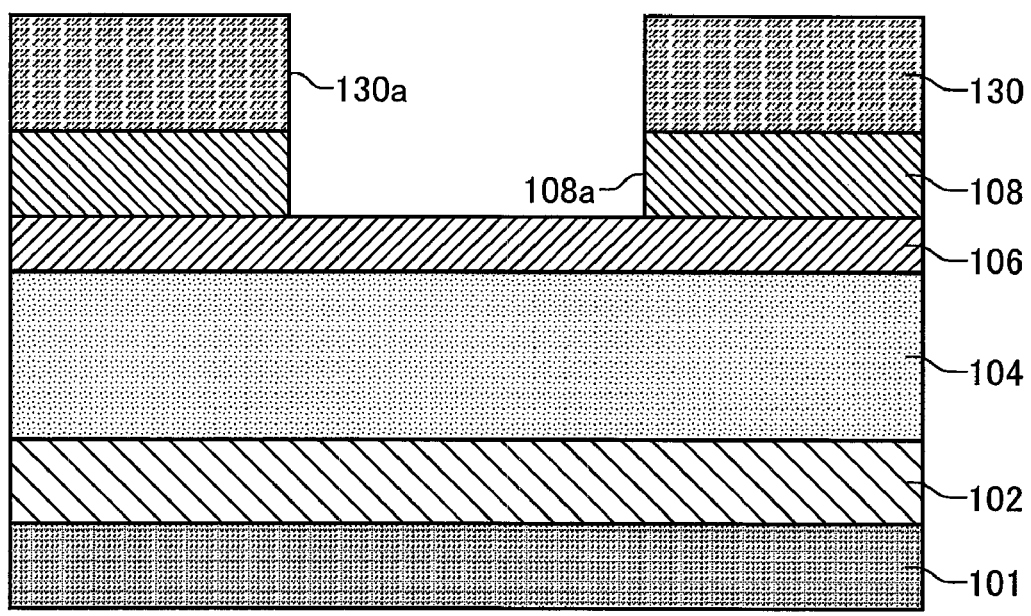
FIG. 4 is a schematic cross-sectional view showing a step of forming a recess of the FET shown in FIG. 1.

After this, dry etching with a chlorine-based gas is used to etch a portion of the electron supplying layer 108 down to the interface layer 106. As a result, the recess 108a is formed (FIG. 4). At this time, a portion of the surface of the interface layer 106 may be etched such that the interface layer 106 is thinner in the region corresponding to the recess 108a than in other regions.

Figure 5:
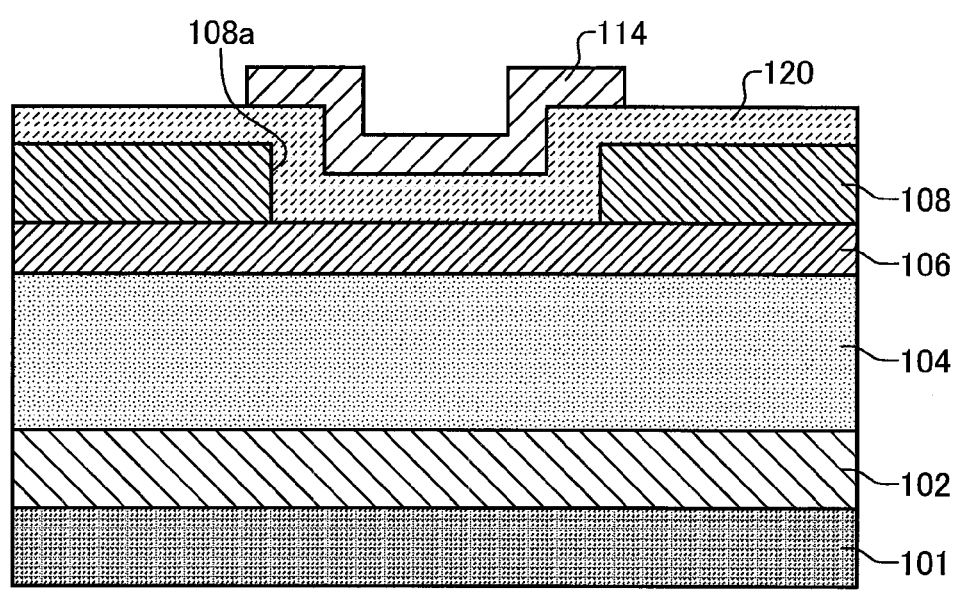
FIG. 5 is a schematic cross-sectional view showing a step of forming an insulating film of the FET shown in FIG. 1.

The mask 130 is removed and the insulating film 120, i.e. a gate insulating film, is formed over the entire surface of the electron supplying layer 108 and the inner surface of the recess 108a. The insulating film 120 may be formed of $SiO_2$ or $Al_2O_3$. The thickness of the insulating film 120 may be 60 nm, for example. The gate electrode 114 of, for example, polysilicon is formed on the insulating film 120 (FIG. 5). The width of the gate electrode 114 may be larger than width of the recess 108a formed in the electron supplying layer 108, or may be the same as the width of the recess 108a.

Next, the insulating film 120 in the regions where the source and drain will may be removed. The source electrode 110 and the drain electrode 112 may be formed to contact the electron supplying layer 108 at least in the portions where the insulating film 120 is removed. The source electrode 110 and the drain electrode 112 may be formed by sputtering and lift-off (FIG. 1). The source electrode 110 and the drain electrode 112 may be formed with a material that achieves ohmic contact with the electron supplying layer 108. For example, the source electrode 110 and the drain electrode 112 may be formed of Ti/Al. Ti/Al represents forming a layer of Ti on the electron supplying layer 108 and forming a layer of Al on the Ti layer. After this, the source electrode 110 and the drain electrode 112 are annealed for 10 minutes at 600° C. to achieve ohmic contact with the electron supplying layer 108.

Figure 6:
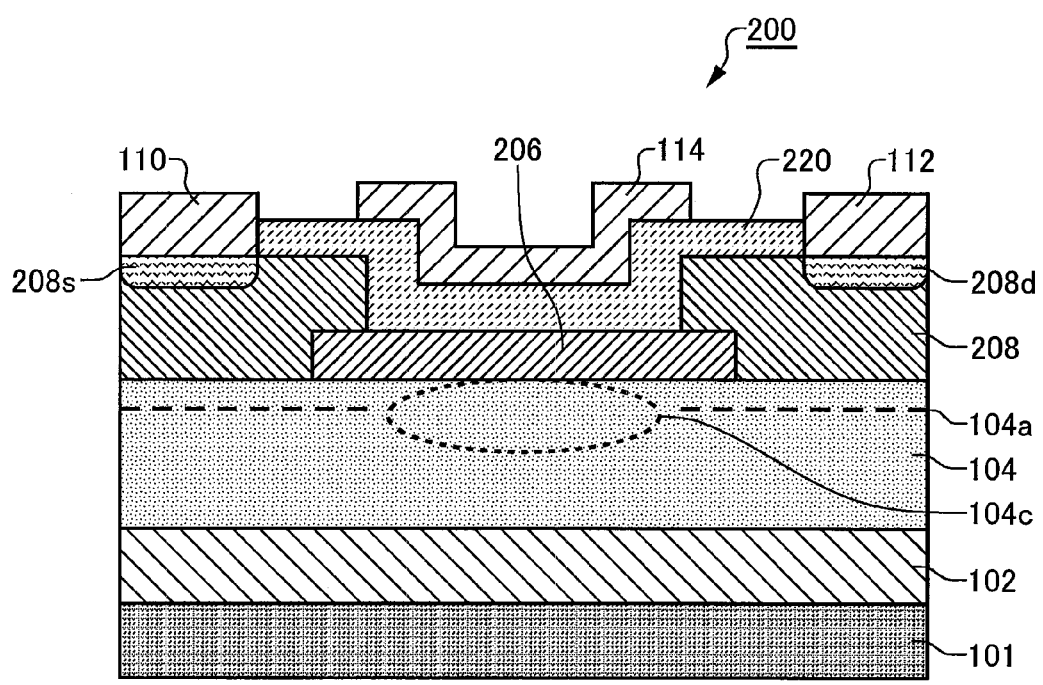
FIG. 6 is a schematic cross-sectional view of a FET according to a second embodiment of the present invention.

FIG. 6 is a schematic cross-sectional view of a FET 200 according to a second embodiment of the present invention. Components in FIG. 6 having the same reference numerals as components in FIG. 1 may adopt the same function and configuration. As shown in FIG. 6, the FET 200 includes a buffer layer 102 on a substrate 101 and a channel layer 104 of group-III nitride-based compound semiconductor, in the same way as the FET 100 shown in FIG. 1. Furthermore, the FET 200 may include an interface layer 206 on at least a portion of the channel layer 104. The interface layer 206 may be provided on a gate section 104c. The gate section 104c is a portion of the channel layer 104 below a gate electrode 114. The interface layer 206 may be formed of group-III nitride-based compound semiconductor. An electron supplying layer 208 may be formed over the portion of the channel layer 104 where the interface layer 206 is not formed. A source electrode and a drain electrode may be formed above portions of the channel layer 104 where the interface layer 206 is not formed.

The electron supplying layer 208 may be formed at the ends of the interface layer 206 to contact the portion of the channel layer 104 where the interface layer 206 is not formed. The electron supplying layer 208 may cover a portion of the top surface of the interface layer 206. The interface layer 206 and the electron supplying layer 208 in FIG. 6 may respectively be formed of the same material as the interface layer 106 and the electron supplying layer 108 shown in FIG. 1. The electron supplying layer 208 may be formed of group-III nitride-based compound semiconductor. The interface layer 206 may be formed of a different material than the channel layer 104. The electron supplying layer 208 may be formed of a different material than the interface layer 206. The electron supplying layer 208 may be formed of a material with larger bandgap energy than the material used for forming the channel layer 104. A 2DEG region 104a may be formed near the interface of the channel layer 104 on the electron supplying layer 208 side, in the portion of the channel layer 104 above which the electron supplying layer 208 is formed and the portion of the channel layer 104 above which the electron supplying layer 208 is formed with the interface layer 206 interposed therebetween. The interface layer 206 may be formed of a material with larger bandgap energy than the material used for forming the electron supplying layer 208. The interface layer 106 may have a thickness that does not cause the 2DEG region 104a to be formed in the channel layer 104 due to the heterojunction between the interface layer and the channel layer 104. The thickness of the interface layer 206 may be larger than or equal to 0.05 nm and less than or equal to 3.0 nm. The portion of the interface layer 206 that does not overlap with the electron supplying layer 208 may have a thickness larger than or equal to 0.05 nm and less than or equal to 3.0 nm, and the portion of the interface layer 206 that does overlap with the electron supplying layer 208 may have a thickness larger than 3.0 nm. The 2DEG region 104a need not be formed in the portion of the channel layer 104 above which the electron supplying layer 208 is formed.

The gate electrode 114 may be formed on an insulating film 220 above the interface layer 206. The source electrode 110 and the drain electrode 112 may be formed on the electron supplying layer 208 with the gate electrode 114, the insulating film 220, and the interface layer 206 therebetween. The source electrode 110 and the drain electrode 112 may be formed may be formed above the portion of the channel layer 104 where the electron supplying layer 208 is formed, without forming the interface layer 206. The electron supplying layer 208 may be formed of a source electrode 110 side contact region 208s and a drain electrode 112 side contact region 208d that respectively contact the source electrode 110 and the drain electrode 112. The contact region 208s contacting the source electrode 110 and the contact region 208d contacting the drain electrode 112 may be n-type regions with n-type carrier concentration higher than that of other portions of the channel layer 104. The contact region 208s and the contact region 208d decrease the contact resistance between the electron supplying layer 208 and the source electrode 110 and drain electrode 112.

The channel layer 104 and the interface layer 206 may be formed of group-III nitride-based compound semiconductor. Therefore, since the crystal periodicity of the channel layer 104 and the interface layer 206 is maintained, the channel layer 104 has high carrier mobility. Furthermore, since the AlN layer with high resistance is not interposed in the current path between the source and the drain, the ON-resistance of the FET 200 is decreased.

The following describes a method of manufacturing the FET 200 according to the second embodiment, with reference to FIGS. 7 to 11. Components in FIGS. 7 to 11 having the same reference numerals as components in FIGS. 1 to 6 may adopt the same function and configuration.

Figure 7:
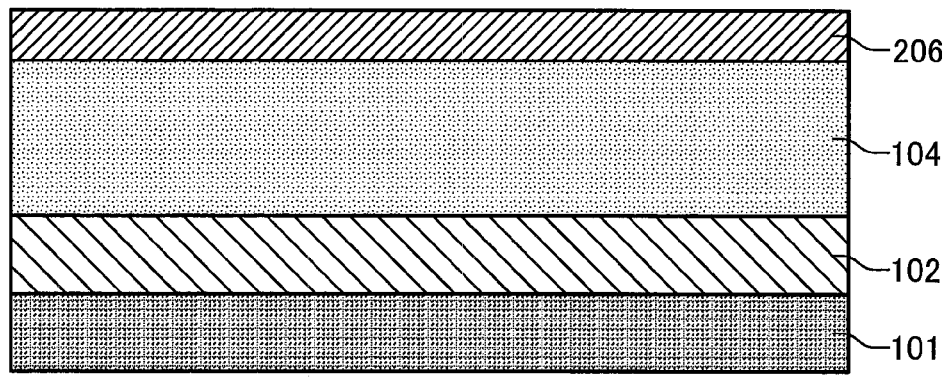
FIG. 7 is a schematic cross-sectional view showing a step of forming a buffer layer, a channel layer, and an interface layer of the FET shown in FIG. 6.

First, the buffer layer 102 may be formed on the substrate 101 of silicon having the (111) plane as a surface for forming the semiconductor layers. The buffer layer 102 may be formed of a plurality of layers including AlGaN/GaN. The channel layer 104 may be formed on the buffer layer 102. The channel layer 104 may be formed of undoped GaN. The interface layer 206 may be formed on the channel layer 104. The interface layer 206 may be formed of AlN. The buffer layer 102, the channel layer 104, and the interface layer 206 may be formed using, as the raw material gas, two or more of trimethyl gallium (TMGa), trimethyl aluminum (TMAl), and ammonia ($NH_3$) (FIG. 7). The buffer layer 102 may have a thickness of approximately 1800 nm, the channel layer 104 may have a thickness of 500 nm, and the interface layer 206 may have a thickness of 1.0 nm, for example.

Figure 8:
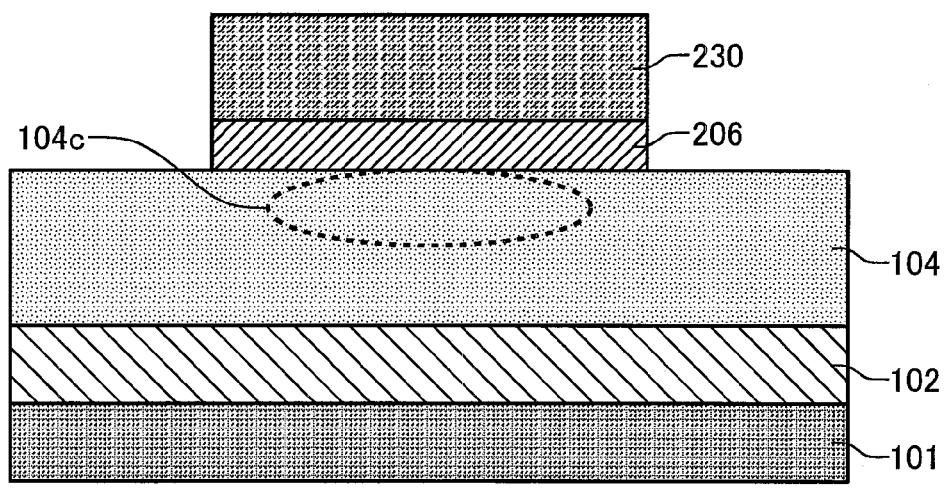
FIG. 8 is a schematic cross-sectional view showing a step of etching the interface layer of the FET shown in FIG. 6.

Next, a $SiO_2$ layer may be formed over the entire surface of the interface layer 206. Photolithography may be used to pattern the $SiO_2$ layer to form a mask 230 having an opening above the channel layer 104, except above the gate section 104c. After this, etching may be used to remove the portion of the interface layer on which the mask 230 is not formed (FIG. 8).

The mask 230 is removed, and the electron supplying layer 208 of $Al_xGa_{1-x}N$, where $0<X \leq 1$, may be grown. At this time, the growth conditions are adjusted such that the surface of the electron supplying layer 208 is flat. Next, a film of $SiO_2$, for example, is formed over the entire surface of the electron supplying layer 208. This $SiO_2$ film may be removed from regions where the source electrode 110 and the drain electrode 112 are to be formed. The contact region 208s and contact region 208d may be formed by implanting Si-ions in the electron supplying layer 208. The ion implantation conditions may be adjusted such that the sheet carrier density of the contact region 208s and the contact region 208d in the surface of the electron supplying layer 208 is $1\times10^{15}$ $cm^{-2}$ and the penetration depth of the ion implantation reaches the channel layer 104. The ion implantation penetration depth indicates the depth at which the sheet carrier density reaches 1% of its maximum value. After this, the $SiO_2$ layer is removed.

Next, an insulating film may be formed over the entire surface of the electron supplying layer 208. The insulating film may be a $SiO_2$ film with a thickness of 500 nm formed using CVD, for example. The electron supplying layer 208 may be annealed to activate the impurities from the ion implantation. For example, the electron supplying layer 208 may be thermally processed for 30 seconds at a temperature of 1200° C. in a nitrogen atmosphere. After the thermal processing, the insulating layer may be removed. For example, the $SiO_2$ insulating film may be removed using hydrofluoric acid.

Figure 9:
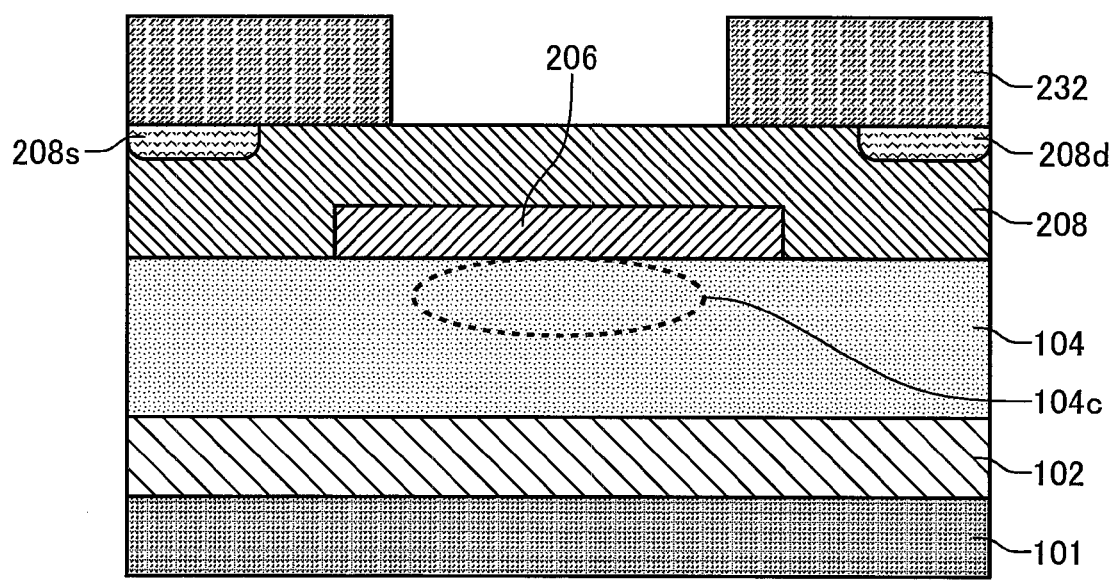
FIG. 9 is a schematic cross-sectional view showing a step of forming an electron supplying layer and a mask for fabricating the FET shown in FIG. 6.

Next, a film of $SiO_2$ may be formed over the entire surface of the electron supplying layer 208, and a mask 232 may be formed by removing the $SiO_2$ film in the region above the gate section 104c (FIG. 9). The mask 232 may be formed covering a portion of the interface layer 206.

Figure 10:
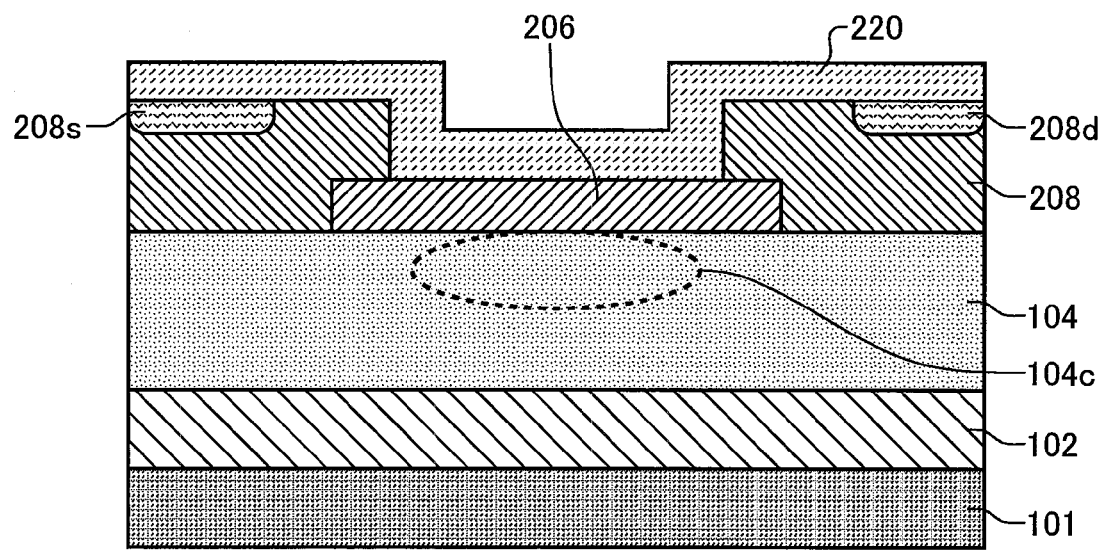
FIG. 10 is a schematic cross-sectional view showing a step of forming an insulating film of the FET shown in FIG. 6.

Next, with the interface layer 206 serving as an etch-stop layer, the portion of the electron supplying layer 208 where the mask 232 is not formed is removed to expose the interface layer 206. At this time, a portion of the surface of the interface layer 206 may be removed by over etching, such that the portion of the interface layer 206 where the mask 232 is not formed is thinner than other portions of the interface layer 206. The ends of the interface layer 206 may be covered by the electron supplying layer 208. By covering the ends of the interface layer 206 with the electron supplying layer 208, the channel layer 104 is not exposed. The mask 232 may be removed and the insulating film 220 may be formed over the entire surface of the electron supplying layer 208 and the exposed interface layer 206 (FIG. 10).

Figure 11:
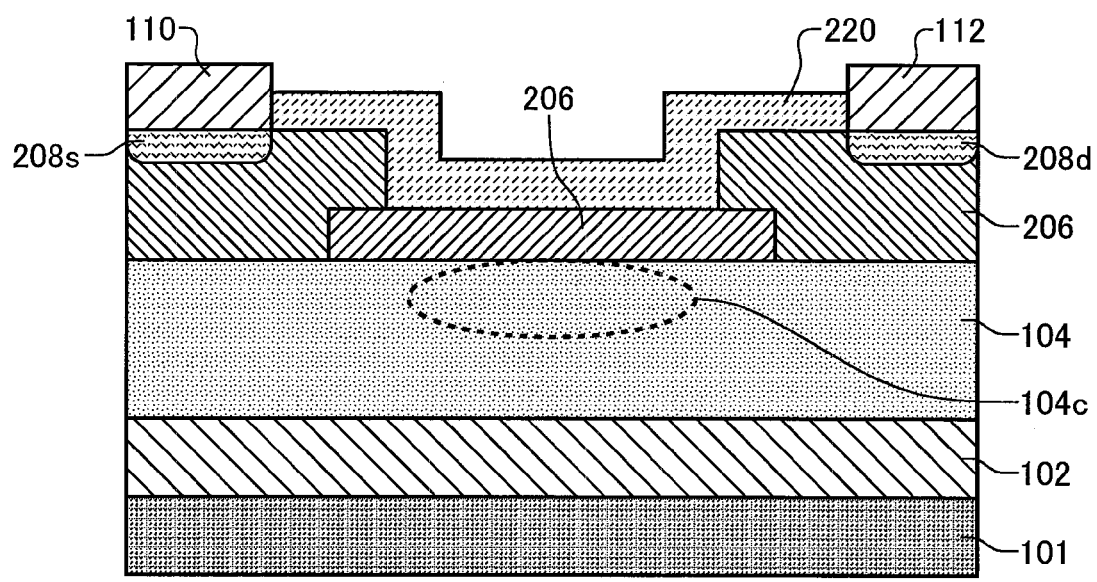
FIG. 11 is a schematic cross-sectional view showing a step of forming a source electrode and a drain electrode of the FET shown in FIG. 6.
Figure 12:
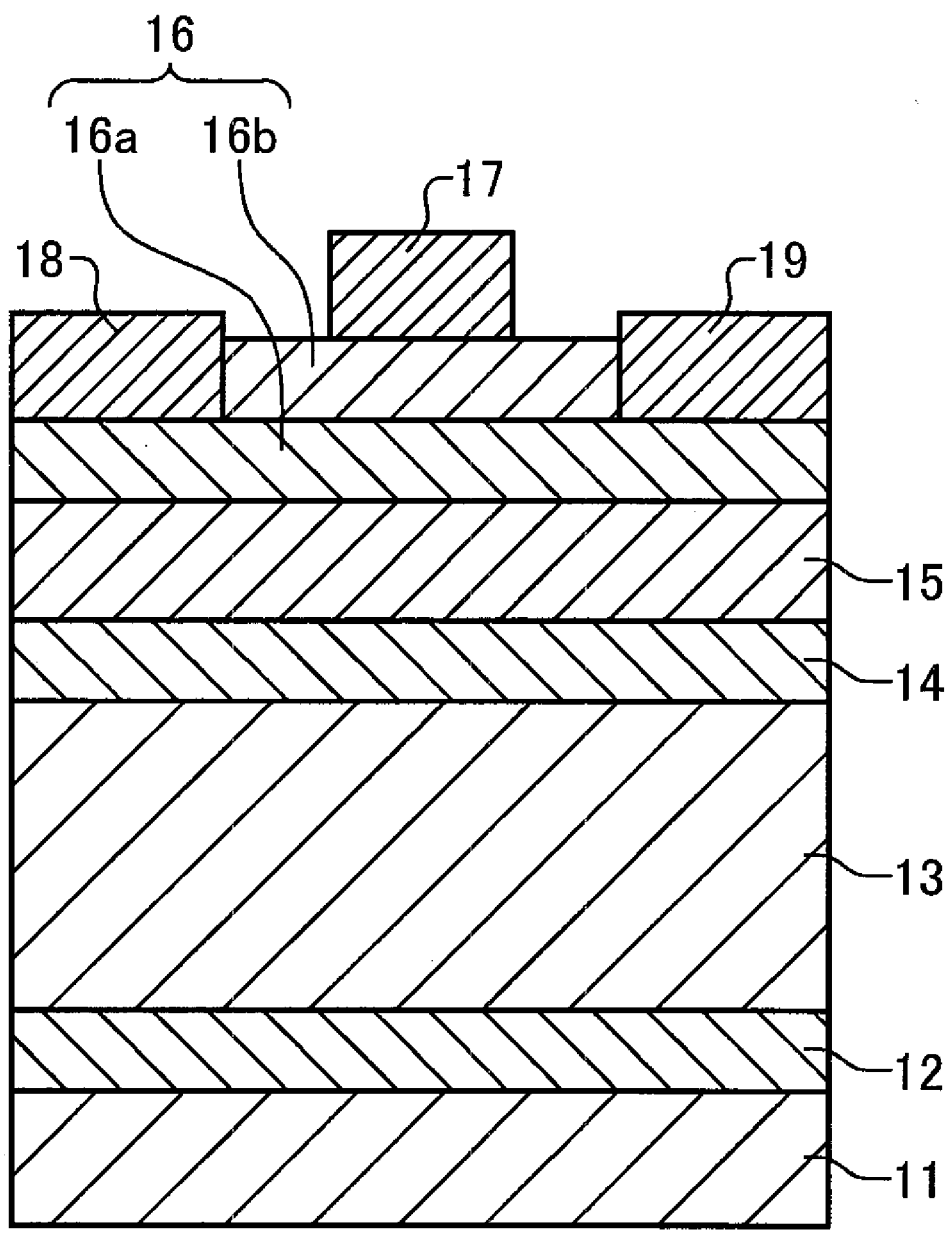
FIG. 12 is a schematic cross-sectional view of a conventional FET.

The portion of the insulating film 220 in the regions where the source electrode 110 and the drain electrode 112 are to be formed may be removed to expose the contact region 208s and the contact region 208d. Next, the source electrode 110 and the drain electrode 112 may be formed respectively on the contact region 208s and the contact region 208d. The source electrode 110 and the drain electrode 112 may be formed using sputtering and lift-off, and annealed for 10 minutes at 600° C. (FIG. 11). The source electrode 110 and the drain electrode 112 may be formed without overlapping with the interface layer 206.

The gate electrode 114 may be formed above the gate section 104c on the insulating film 220. The gate electrode 114 may be made of Ti/Al and formed by sputtering and lift-off. Ti/Al represents forming a layer of Ti on the insulating film 220 and forming a layer of Al on the Ti layer. The width of the gate electrode 114 may be larger than the width of the opening formed in the electron supplying layer 208, or may be equal to the width of the opening formed in the electron supplying layer 208.

The steps described above can be altered without deviating from the scope of the present invention. For example, the source electrode 110 and the drain electrode 112 are not limited to having Ti/Al layered structures, and may be made of any material that can achieve ohmic contact with the electron supplying layer 108 (or the contact regions 208s and 208d).

Furthermore, the materials forming the semiconductor elements are not limited to GaN and AlGaN, and any group-III nitride-based compound semiconductor expressed as $Al_X In_Y Ga_{1-X-Y}N$, where $0 \leq X \leq 1, 0 \leq Y \leq 1$, and $0 \leq X+Y \leq 1$, may be used instead. Furthermore, the substrate may be made of known materials such as Si, SiC, ZnO, sapphire, GaN, or the like.

While the embodiments of the present invention have been described, the technical scope of the invention is not limited to the above described embodiments. It is apparent to persons skilled in the art that various modifications and improvements can be added to the above-described embodiments. It is also apparent from the scope of the claims that the embodiments added with such modifications or improvements can be included in the technical scope of the invention.

The operations, procedures, steps, and stages of each process performed in relation to the apparatus and manufacturing method shown in the claims, embodiments, or drawings can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A field effect transistor comprising:
   a channel layer of first group-III nitride-based compound semiconductor;
   an interface layer of second group-III nitride-based compound semiconductor, wherein the interface layer has a thickness that does not cause a 2-dimensional electron gas in the channel layer;
   an electron supplying layer of third group-III nitride-based compound semiconductor formed on the interface layer, the electron supplying layer having a recess that reaches the interface layer;
   a source electrode and a drain electrode formed on the electron supplying layer on respective sides of the recess;
   an insulating film formed on an inner surface of the recess; and
   a gate electrode formed on the insulating film.

2. The field effect transistor according to claim 1, wherein a thickness of a portion of the interface layer corresponding to the gate electrode is no less than 0.05 nanometers and no larger than 3.0 nanometers.

3. A field effect transistor comprising:
   a channel layer of first group-III nitride-based compound semiconductor;
   an interface layer of second group-III nitride-based compound semiconductor formed on a first portion of the channel layer;
   an electron supplying layer of third group-III nitride-based compound semiconductor formed on second portions of the channel layer on both sides of the interface layer across the first portion;
   a source electrode and a drain electrode formed on the electron supplying layer on respective sides;
   an insulating film formed on the interface layer; and
   a gate electrode foamed on the insulating film.

4. The field effect transistor according to claim 3, wherein the interface layer has a thickness that does not cause a 2-dimensional electron gas in the channel layer.

5. The field effect transistor according to claim 3, wherein a thickness of a portion of the interface layer that does not overlap with the electron supplying layer is no less than 0.05 nanometers and no larger than 3.0 nanometers.

6. The field effect transistor according to claim 3, wherein the first to third group-III nitride-based compound semiconductors are $Al_X In_Y Ga_{1-X-Y}N$, where $0 \leq X \leq 1$, $0 \leq Y \leq 1$, and $X+Y \leq 1$,
   the third group-III nitride-based compound semiconductor has a larger bandgap energy than the first group-III nitride-based compound semiconductor, and the second group-III nitride-based compound semiconductor has a larger bandgap energy than the third group-III nitride-based compound semiconductor.

7. A field effect transistor comprising:
   a channel layer of first group-III nitride-based compound semiconductor, wherein the first group-III nitride-based compound semiconductor is $Al_X b_Y Ga_{1-X-Y}N$, where $0 \leq X \leq 1$, $0 \leq Y \leq 1$, and $X+Y \leq 1$;
   an interface layer of second group-III nitride-based compound semiconductor, wherein the second group-III nitride-based compound semiconductor is $Al_X In_Y Ga_{1-X-Y}N$, where $0 \leq X \leq 1$, $0 \leq Y \leq 1$, and $X+Y \leq 1$, and the second group-III nitride-based compound semiconductor has a larger bandgap energy than the third group-III nitride-based compound semiconductor;
   an electron supplying layer of third group-III nitride-based compound semiconductor formed on the interface layer, the electron supplying layer having a recess that reaches the interface layer;
   a source electrode and a drain electrode formed on the electron supplying layer on respective sides of the recess;
   an insulating film formed on an inner surface of the recess; and
   a gate electrode formed on the insulating film.

8. The field effect transistor according to claim 7, wherein the third group-III nitride-based compound semiconductor is $Al_X In_Y Ga_{1-X-Y}N$, where $0 \leq X \leq 1$, $0 \leq Y \leq 1$, and $X+Y \leq 1$, and
   the third group-III nitride-based compound semiconductor has greater bandgap energy than the first group-III nitride-based compound semiconductor.

9. The field effect transistor according to claim 8, wherein the channel layer is GaN, the interface layer is AlN, and the electron supplying layer is AlGaN.

* * * * *